(12) United States Patent
Koury, Jr.

(10) Patent No.: US 8,564,075 B1
(45) Date of Patent: Oct. 22, 2013

(54) PACKAGE TOLERATE DESIGN AND METHOD

(75) Inventor: Daniel N. Koury, Jr., Cupertino, CA (US)

(73) Assignee: mCube Inc., San Jose, CA (US)

(*) Notice: Subject to any disclaimer, the term of this patent is extended or adjusted under 35 U.S.C. 154(b) by 115 days.

(21) Appl. No.: 13/090,234

(22) Filed: Apr. 19, 2011

Related U.S. Application Data

(60) Provisional application No. 61/326,594, filed on Apr. 21, 2010.

(51) Int. Cl.
*H01L 27/14* (2006.01)

(52) U.S. Cl.
USPC ............ 257/414; 257/415; 257/417; 257/420

(58) Field of Classification Search
USPC .................................................. 257/414, 678
See application file for complete search history.

(56) References Cited

U.S. PATENT DOCUMENTS

| | | |
|---|---|---|
| 6,188,322 B1 | 2/2001 | Yao et al. |
| 7,430,909 B2 * | 10/2008 | Adams et al. ................ 73/510 |
| 2004/0016995 A1 | 1/2004 | Kuo et al. |
| 2004/0227201 A1 | 11/2004 | Borwick, III et al. |
| 2005/0252293 A1 | 11/2005 | Wong et al. |
| 2008/0014682 A1 | 1/2008 | Yang et al. |
| 2011/0265574 A1 | 11/2011 | Yang |

OTHER PUBLICATIONS

International Search Report and Written Opinion of PCT Application No. PCT/US10/054567, mailed on Jan. 6, 2011, 7 pages total.
Office Action for U.S. Appl. No. 12/945,087, mailed on Mar. 19, 2012, 6 pages.

* cited by examiner

*Primary Examiner* — Stephen W Smoot
*Assistant Examiner* — Vicki B Booker
(74) *Attorney, Agent, or Firm* — Kilpatrick Townsend & Stockton LLP

(57) ABSTRACT

An improved MEMS transducer apparatus and method. The apparatus has a movable base structure including an outer surface region and an inner surface region. At least one central anchor structure can be spatially disposed within a vicinity of the inner surface region and at least one peripheral anchor structure can be spatially disposed within a vicinity of the outer surface region. Additionally, the apparatus can have at least one peripheral spring structure. The peripheral spring structure(s) can be coupled to the peripheral anchor structure(s) and at least one portion of the outer surface region. The apparatus can also have at least one central spring structure. The central spring structure(s) can be operably coupled to the central anchor structure(s) and at least one portion of the inner surface region.

9 Claims, 5 Drawing Sheets

PACKAGE TOLERATE DESIGN AND METHOD

CROSS-REFERENCES TO RELATED APPLICATIONS

The present application claims priority to and incorporates by reference, for all purposes, the following pending patent application: U.S. Pat. App. No. 61/326,594, filed Apr. 21, 2010. The present invention also incorporates by reference, for all purposes, the following co-pending patent applications: U.S. patent application Ser. No. 12/859,672, filed Aug. 19, 2010, U.S. patent application Ser. No. 12/859,647, filed Aug. 19, 2010, U.S. patent application Ser. No. 12/490,067, filed Jun. 23, 2009, U.S. patent application Ser. No. 12/945,087, filed Nov. 12, 2010, and U.S. patent application Ser. No. 12/913,440, filed Oct. 27, 2010.

BACKGROUND OF THE INVENTION

The present invention relates generally to integrated devices. More specifically, the present invention provides an integrated transducer apparatus that can be used in combination with other MEMS devices, but can be used with others as well. Merely by way of example, the MEMS devices can include at least an accelerometer, an angular rate sensor, a magnetic field sensor, a pressure sensor, a microphone, a humidity sensor, a temperature sensor, a chemical sensor, a biosensor, an inertial sensor, and others. But it will be recognized that the invention has a much broader range of applicability.

Research and development in integrated microelectronics have continued to produce astounding progress in CMOS and MEMS technology. CMOS technology has become the predominant fabrication technology for integrated circuits (IC). In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna system, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS technology has limitless applications through modular measurement devices such as accelerometers, angular rate sensors, actuators, and other sensors. In conventional vehicles, accelerometers and angular rate sensors are used to deploy airbags and trigger dynamic stability control functions, respectively. MEMS angular rate sensors can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

According to the present invention, techniques related generally to integrated devices and systems are provided. More specifically, the present invention provides an improved MEMS transducer apparatus that can be used in combination with other MEMS devices or other devices. Merely by way of example, the MEMS devices can include at least an accelerometer, an angular rate sensor, a magnetic field sensor, a pressure sensor, a microphone, a humidity sensor, a temperature sensor, a chemical sensor, a biosensor, an inertial sensor, and others. But it will be recognized that the invention has a much broader range of applicability.

In a specific embodiment, the present invention provides an integrated transducer apparatus. The apparatus has a movable base structure including an outer surface region and an inner surface region. At least one central anchor structure can be spatially disposed within a vicinity of the inner surface region and at least one peripheral anchor structure can be spatially disposed within a vicinity of the outer surface region. Additionally, the apparatus can have at least one peripheral spring structure. The peripheral spring structure(s) can be coupled to the peripheral anchor structure(s) and at least one portion of the outer surface region. The apparatus can also have at least one central spring structure(s). The central spring structure(s) can be operably coupled to the central anchor structure(s) and at least one portion of the inner surface region.

Many benefits are achieved by way of the present invention over conventional techniques. For example, the present technique provides an easy to use process that relies upon conventional technology. In some embodiments, the method provides higher device yields in dice per wafer with the integrated approach. Additionally, the method provides a process and apparatus that are compatible with conventional process technology without substantial modifications to conventional equipment and processes. Preferably, the invention provides for an improved MEMS device apparatus and related applications for a variety of uses. In other embodiments, the present invention provides an improved MEMS transducer apparatus, which may be integrated on at least one integrated electronic device structure. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow

DETAILED DESCRIPTION OF THE INVENTION

According to the present invention, techniques related generally to integrated devices and systems are provided. More specifically, the present invention provides an improved MEMS transducer apparatus that can be used with other MEMS devices or other devices. Merely by way of example, the MEMS devices can include at least an accelerometer, an angular rate sensor, a magnetic field sensor, a pressure sensor, a microphone, a humidity sensor, a temperature sensor, a chemical sensor, a biosensor, an inertial sensor, and others. But it will be recognized that the invention has a much broader range of applicability.

Figure 1:
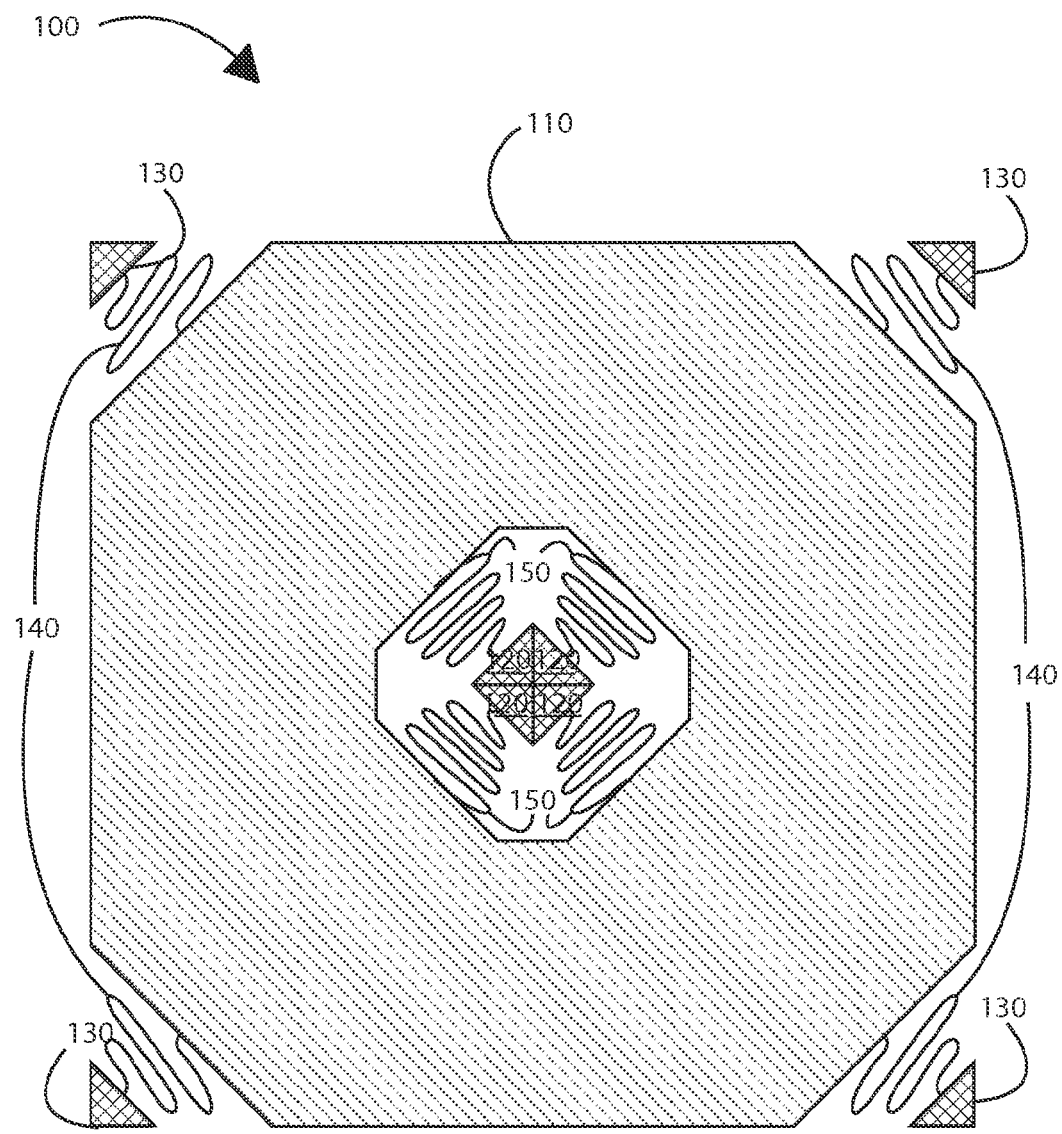
FIG. 1 is a simplified top diagram of a transducer apparatus according to an embodiment of the present invention.

FIG. 1 is a simplified top diagram of a transducer apparatus according to an embodiment of the present invention. This diagram is merely an example, which should not unduly limit the scope of the claims herein. One of ordinary skill in the art would recognize other variations, modifications, and alternatives. As shown, apparatus 100 includes a movable base structure 110, at least one central anchor structure 120, at least one peripheral anchor structure 130, at least one peripheral spring structure 140, and at least one central spring structure 150. In an embodiment, apparatus 100 can be configured to improve tolerance of external deformations. Those of ordinary skill in the art will recognize other variations, modifications, and alternatives.

In an embodiment, movable base structure 110 can have an outer surface region and an inner surface region. In a specific embodiment, movable base structure 110 can include a single crystal silicon, polycrystalline silicon, or amorphous silicon. Moveable base structure 110 can also include a thickness of a polymer or a thickness of a metal material. In other embodiments, movable base structure 110 can include other materials and combinations thereof. Those skilled in the art will recognize other variations, modifications, and alternatives.

In an embodiment, central anchor structure(s) 120 can be spatially disposed within a vicinity of the inner surface region of the movable base structure. Also, peripheral anchor structure(s) 130 can be spatially disposed within a vicinity of the outer surface region of movable base structure 110. In a specific embodiment, central anchor structure(s) 120 and the peripheral anchor structure(s) 130 can include single crystal silicon, polycrystalline silicon, or amorphous silicon. Anchor structures 120 and 130 can also include a polymer or metal material, or other materials or combinations thereof. Of course, there can be other variations, modifications, and alternatives.

In an embodiment, central spring structure(s) 150 can be operably coupled to the central anchor structure(s) 120 and at least one portion of the inner surface region of movable base structure 110. Also, peripheral spring structure(s) 140 can be operably coupled to peripheral anchor structure(s) 130 and at least one portion of the outer surface region of movable base structure 110. In a specific embodiment, central spring structure(s) 150 and peripheral spring structure(s) 140 can include single crystal silicon, polycrystalline silicon, or amorphous silicon. Spring structures 140 and 150 can also include a polymer or metal material, or other materials or combinations thereof. Those skilled in the art will recognize other variations, modifications, and alternatives.

In an embodiment, apparatus 100 can include at least one capacitor element spatially disposed between the outer surface region and the inner surface region of movable base structure 110. In a specific embodiment, the number of central spring structure(s) 150 can be proportional to the number of the capacitor element(s). Also, the configuration of central spring structure(s) 150 can depend on the configuration of the capacitor element(s). The capacitor element(s) can include a fixed capacitor element and a movable capacitor element. The movable capacitor element will generally be a portion of the movable base structure. In a specific embodiment, the critical physical basis of apparatus 100 is to have the average displacement of the fixed capacitor element(s) match the average displacement of the movable capacitor element(s). Of course, there can be other variations, modifications, and alternatives.

In an embodiment, movable base structure 110 can be a rectangular movable base structure. In a specific embodiment, peripheral anchor structures 130 are spatially disposed within a vicinity of the outer surface region near each of the corners of the rectangular movable base structure. Also, central anchor structure(s) 120 can be spatially disposed near the center of the rectangular movable base structure. In an embodiment, apparatus 100 can be coupled to a MEMS device or an electronic device. In a specific embodiment, apparatus 100 can be configured to be tolerant of external deformations. There can be other variations, modifications, and alternatives as well.

It is also understood that the examples and embodiments described herein are for illustrative purposes only and that various modifications or changes in light thereof will be suggested to persons skilled in the art and are to be included within the spirit and purview of this application and scope of the appended claims.

Figure 2:
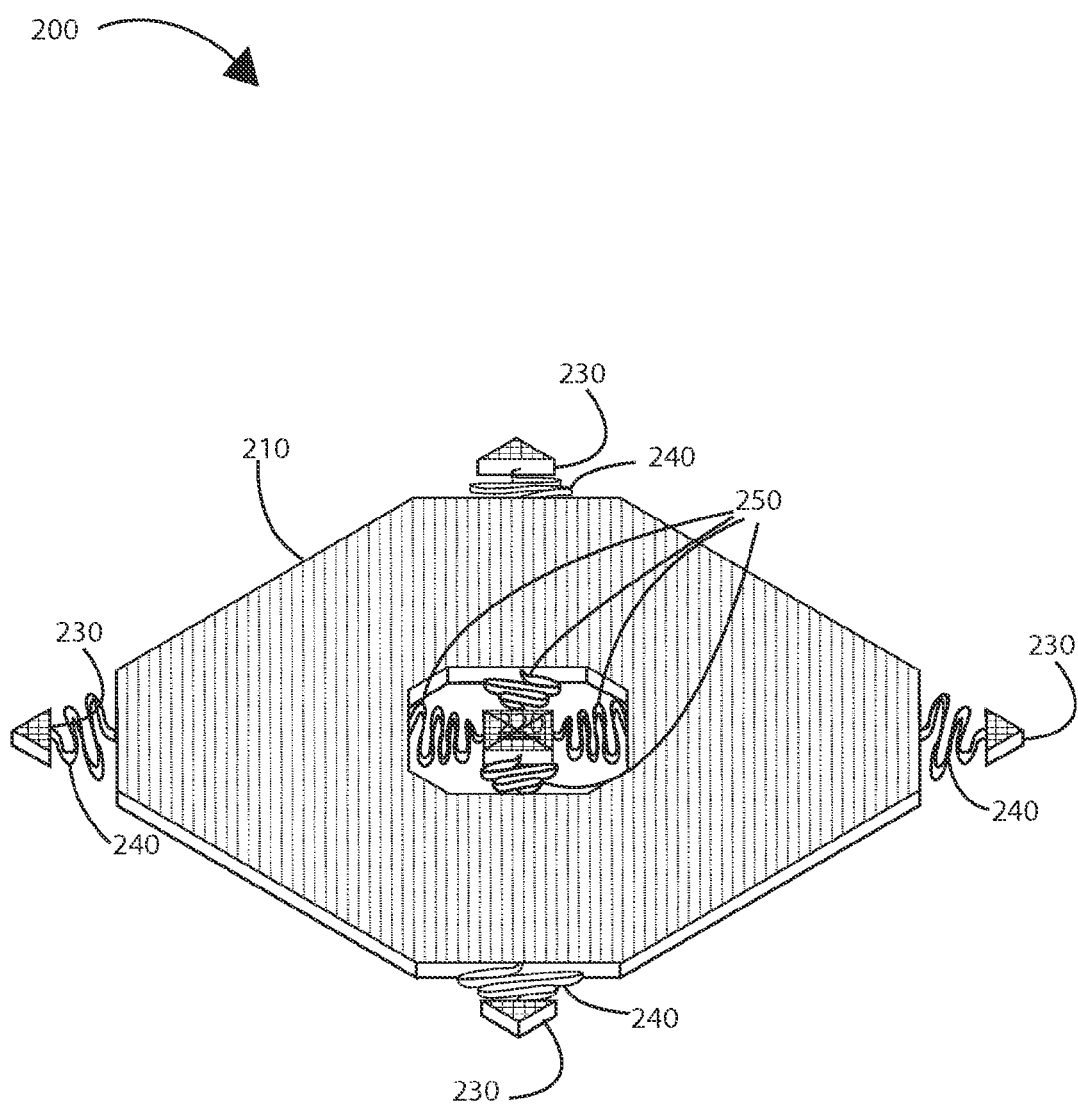
FIG. 2 is a simplified perspective diagram of a transducer apparatus according to an embodiment of the present invention.

FIG. 2 is a simplified perspective diagram of a transducer apparatus according to an embodiment of the present invention. This diagram is merely an example, which should not unduly limit the scope of the claims herein. One of ordinary skill in the art would recognize other variations, modifications, and alternatives. As shown, apparatus 200 includes a movable base structure 210, at least one central anchor structure 220, at least one peripheral anchor structure 230, at least one peripheral spring structure 240, and at least one central spring structure 250. In an embodiment, apparatus 200 can be configured to improve tolerance of external deformations. Those of ordinary skill in the art will recognize other variations, modifications, and alternatives.

In an embodiment, movable base structure 210 can have an outer surface region and an inner surface region. In a specific embodiment, movable base structure 210 can include a single crystal silicon, polycrystalline silicon, or amorphous silicon. Moveable base structure 210 can also include a thickness of a polymer or a thickness of a metal material. In other embodiments, movable base structure 210 can include other materials and combinations thereof. Those skilled in the art will recognize other variations, modifications, and alternatives.

In an embodiment, central anchor structure(s) 220 can be spatially disposed within a vicinity of the inner surface region of the movable base structure. Also, peripheral anchor structure(s) 230 can be spatially disposed within a vicinity of the outer surface region of movable base structure 210. In a specific embodiment, central anchor structure(s) 220 and peripheral anchor structure(s) 230 can include single crystal silicon, polycrystalline silicon, or amorphous silicon. Anchor structures 220 and 230 can also include a polymer or metal material, or other materials or combinations thereof. Of course, there can be other variations, modifications, and alternatives.

In an embodiment, central spring structure(s) 250 can be operably coupled to central anchor structure(s) 220 and at least one portion of the inner surface region of movable base structure 210. Also, peripheral spring structure(s) 240 can be operably coupled to peripheral anchor structure(s) 230 and at least one portion of the outer surface region of movable base structure 210. In a specific embodiment, central spring structure(s) 250 and peripheral spring structure(s) 240 can include single crystal silicon, polycrystalline silicon, or amorphous silicon. Spring structures 240 and 250 can also include a polymer or metal material, or other materials or combinations thereof. Those skilled in the art will recognize other variations, modifications, and alternatives.

In an embodiment, apparatus 200 can include at least one capacitor element spatially disposed between the outer surface region and the inner surface region of movable base structure 210. In a specific embodiment, the number of central spring structure(s) 250 can be proportional to the number of the capacitor element(s). Also, the configuration of central spring structure(s) 250 can depend on the configuration of the capacitor element(s). The capacitor element(s) can include a fixed capacitor element and a movable capacitor element. In a specific embodiment, the critical physical basis of apparatus 200 is to have the average displacement of the fixed capacitor element match the average displacement of the movable capacitor element. Of course, there can be other variations, modifications, and alternatives.

In an embodiment, movable base structure 210 can be a rectangular movable base structure. In a specific embodiment, peripheral anchor structure(s) 230 are spatially disposed within a vicinity of the outer surface region near each of the corners of the rectangular movable base structure. Also, central anchor structure(s) 220 can be spatially disposed near the center of the rectangular movable base structure. In an embodiment, apparatus 200 can be coupled to a MEMS device or an electronic device. In a specific embodiment, apparatus 200 can be configured to be tolerant of external deformations. There can be other variations, modifications, and alternatives as well.

It is also understood that the examples and embodiments described herein are for illustrative purposes only and that various modifications or changes in light thereof will be suggested to persons skilled in the art and are to be included within the spirit and purview of this application and scope of the appended claims.

Figure 3:
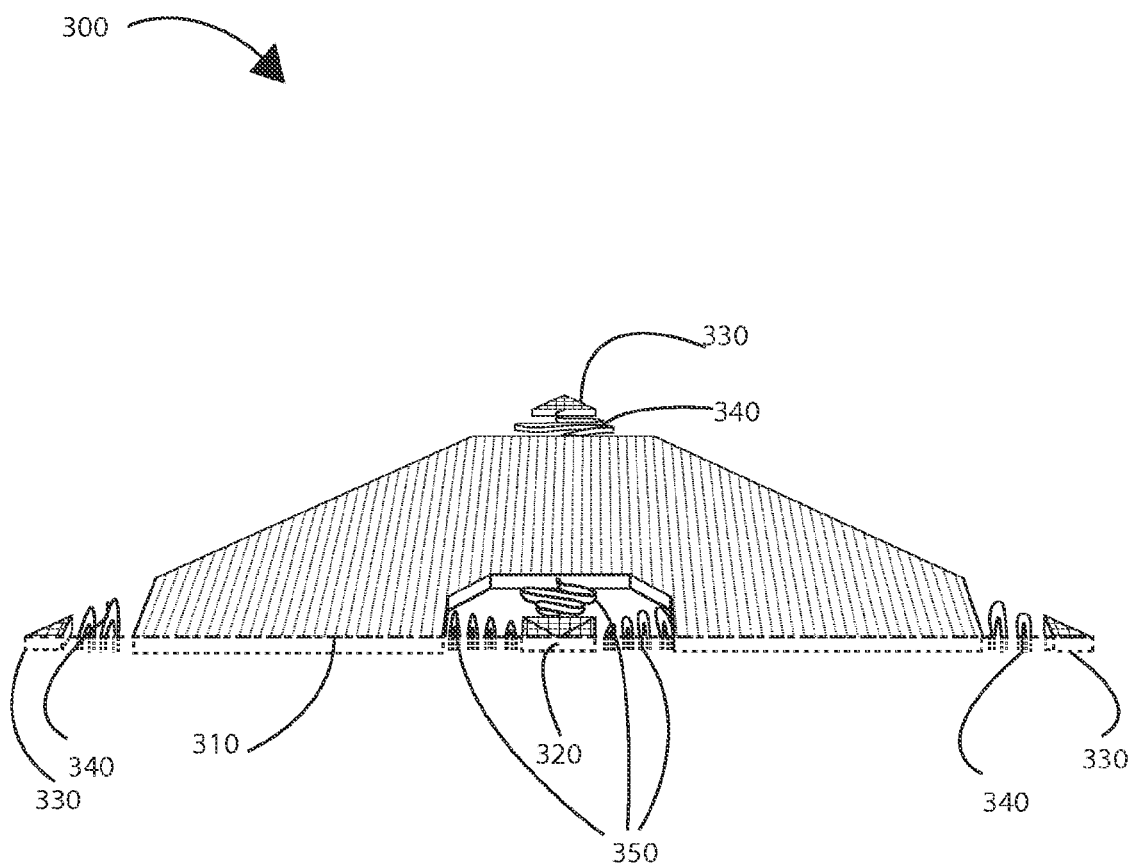
FIG. 3 is a simplified cross-sectional side diagram of a transducer apparatus according to an embodiment of the present invention.

FIG. 3 is a simplified cross-sectional side diagram of a transducer apparatus according to an embodiment of the present invention. This diagram is merely an example, which should not unduly limit the scope of the claims herein. One of ordinary skill in the art would recognize other variations, modifications, and alternatives. As shown, apparatus 300 includes a movable base structure 310, at least one central anchor structure 320, at least one peripheral anchor structure 330, at least one peripheral spring structure 340, and at least one central spring structure 350. In an embodiment, apparatus 300 can be configured to improve tolerance of external deformations. Those of ordinary skill in the art will recognize other variations, modifications, and alternatives.

In an embodiment, movable base structure 310 can have an outer surface region and an inner surface region. In a specific embodiment, movable base structure 310 can include a single crystal silicon, polycrystalline silicon, or amorphous silicon. Moveable base structure 310 can also include a thickness of a polymer or a thickness of a metal material. In other embodiments, movable base structure 310 can include other materials and combinations thereof. Those skilled in the art will recognize other variations, modifications, and alternatives.

In an embodiment, central anchor structure(s) 320 can be spatially disposed within a vicinity of the inner surface region of the movable base structure. Also, peripheral anchor structure(s) 330 can be spatially disposed within a vicinity of the outer surface region of movable base structure 310. In a specific embodiment, central anchor structure(s) 320 and peripheral anchor structure(s) 330 can include single crystal silicon, polycrystalline silicon, or amorphous silicon. Anchor structures 320 and 330 can also include a polymer or metal material, or other materials or combinations thereof. Of course, there can be other variations, modifications, and alternatives.

In an embodiment, central spring structure(s) 350 can be operably coupled to central anchor structure(s) 320 and at least one portion of the inner surface region of movable base structure 310. Also, peripheral spring structure(s) 340 can be operably coupled to peripheral anchor structure(s) 330 and at least one portion of the outer surface region of movable base structure 310. In a specific embodiment, central spring structure(s) 350 and peripheral spring structure(s) 340 can include single crystal silicon, polycrystalline silicon, or amorphous silicon. Spring structures 340 and 350 can also include a polymer or metal material, or other materials or combinations thereof. Those skilled in the art will recognize other variations, modifications, and alternatives.

In an embodiment, apparatus 300 can include at least one capacitor element spatially disposed between the outer surface region and the inner surface region of movable base structure 310. In a specific embodiment, the number of central spring structure(s) 350 can be proportional to the number of the capacitor element(s). Also, the configuration of central spring structure(s) 350 can depend on the configuration of the capacitor element(s). The capacitor element(s) can include a fixed capacitor element and a movable capacitor element. The critical physical basis of apparatus 300 is to have the average displacement of the fixed capacitor element match the average displacement of the movable capacitor element. In a specific embodiment, the fixed capacitor element(s) can be situated in roughly rectangular holes cut in movable base structure 310. The rectangular holes can be produced via an etching process. In a specific embodiment, the capacitor elements can be disposed in pairs within each of the rectangular holes. Of course, there can be other variations, modifications, and alternatives.

In an embodiment, movable base structure 310 can be a rectangular movable base structure. In a specific embodiment, peripheral anchor structure(s) 330 are spatially disposed within a vicinity of the outer surface region near each of the corners of the rectangular movable base structure. Also, central anchor structure(s) 320 can be spatially disposed near the center of the rectangular movable base structure. In an embodiment, apparatus 300 can be coupled to a MEMS device or an electronic device. In a specific embodiment, apparatus 300 can be configured to be tolerant of external deformations. There can be other variations, modifications, and alternatives as well.

It is also understood that the examples and embodiments described herein are for illustrative purposes only and that various modifications or changes in light thereof will be suggested to persons skilled in the art and are to be included within the spirit and purview of this application and scope of the appended claims.

Figure 4:
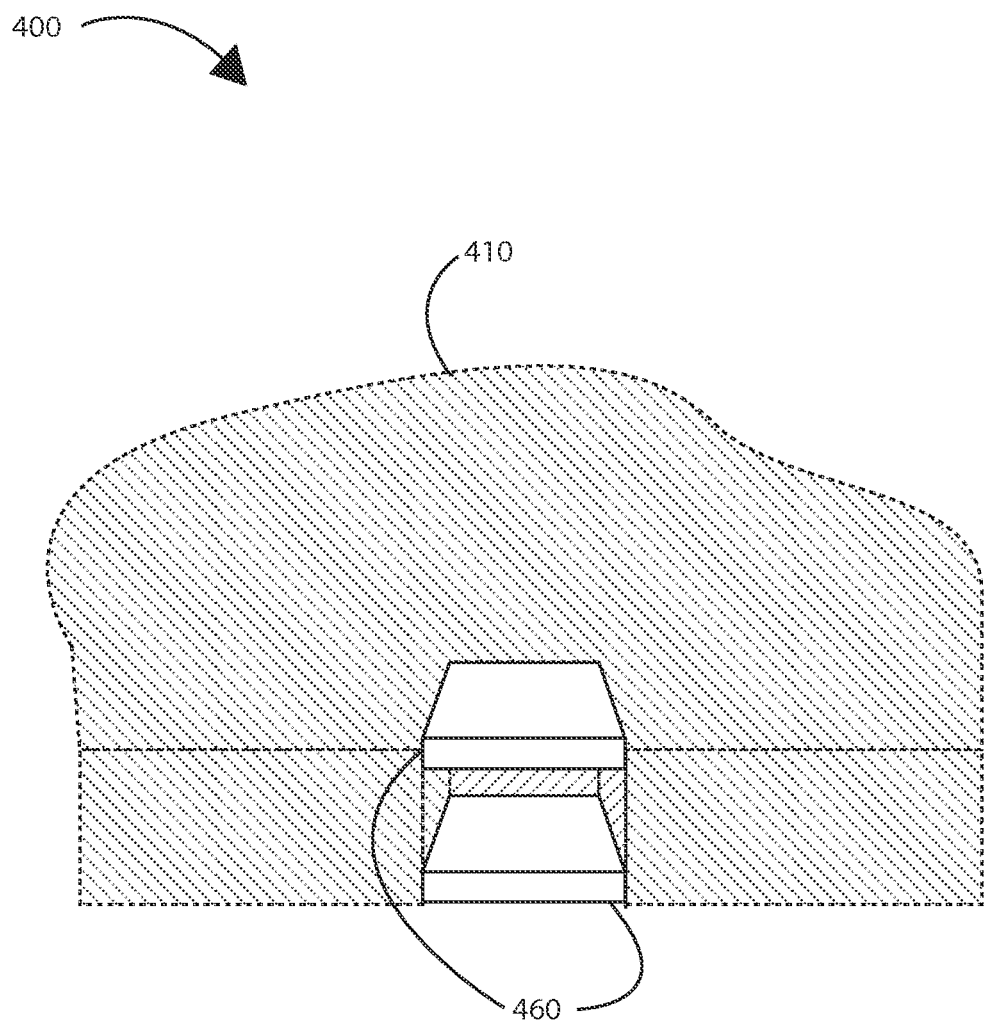
FIG. 4 is a simplified cross-sectional close-up diagram of a transducer apparatus according to an embodiment of the present invention.

FIG. 4 is a simplified cross-sectional close-up diagram of a transducer apparatus according to an embodiment of the present invention. This diagram is merely an example, which should not unduly limit the scope of the claims herein. One of ordinary skill in the art would recognize other variations, modifications, and alternatives. As shown, apparatus 400 includes a movable base structure 410 and at least one capacitor element 460. In an embodiment, apparatus 400 can be configured to improve tolerance of external deformations. Those of ordinary skill in the art will recognize other variations, modifications, and alternatives.

In an embodiment, movable base structure 410 can have an outer surface region and an inner surface region. In a specific embodiment, movable base structure 410 can include a single crystal silicon, polycrystalline silicon, or amorphous silicon. Moveable base structure 410 can also include a thickness of a polymer or a thickness of a metal material. In other embodiments, movable base structure 410 can include other materials and combinations thereof. Those skilled in the art will recognize other variations, modifications, and alternatives.

In an embodiment, apparatus 400 can include at least one capacitor element 460 spatially disposed between the outer surface region and the inner surface region of movable base structure 410. The capacitor element(s) can include a fixed capacitor element and a movable capacitor element. The critical physical basis of apparatus 400 is to have the average displacement of the fixed capacitor element match the average displacement of the movable capacitor element. In a specific embodiment, the fixed capacitor elements can be situated in roughly rectangular holes cut in movable base structure 410. The rectangular holes can be produced via an etching process. In a specific embodiment, the capacitor element(s) can be disposed in pairs within each of the rectangular holes. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 5:
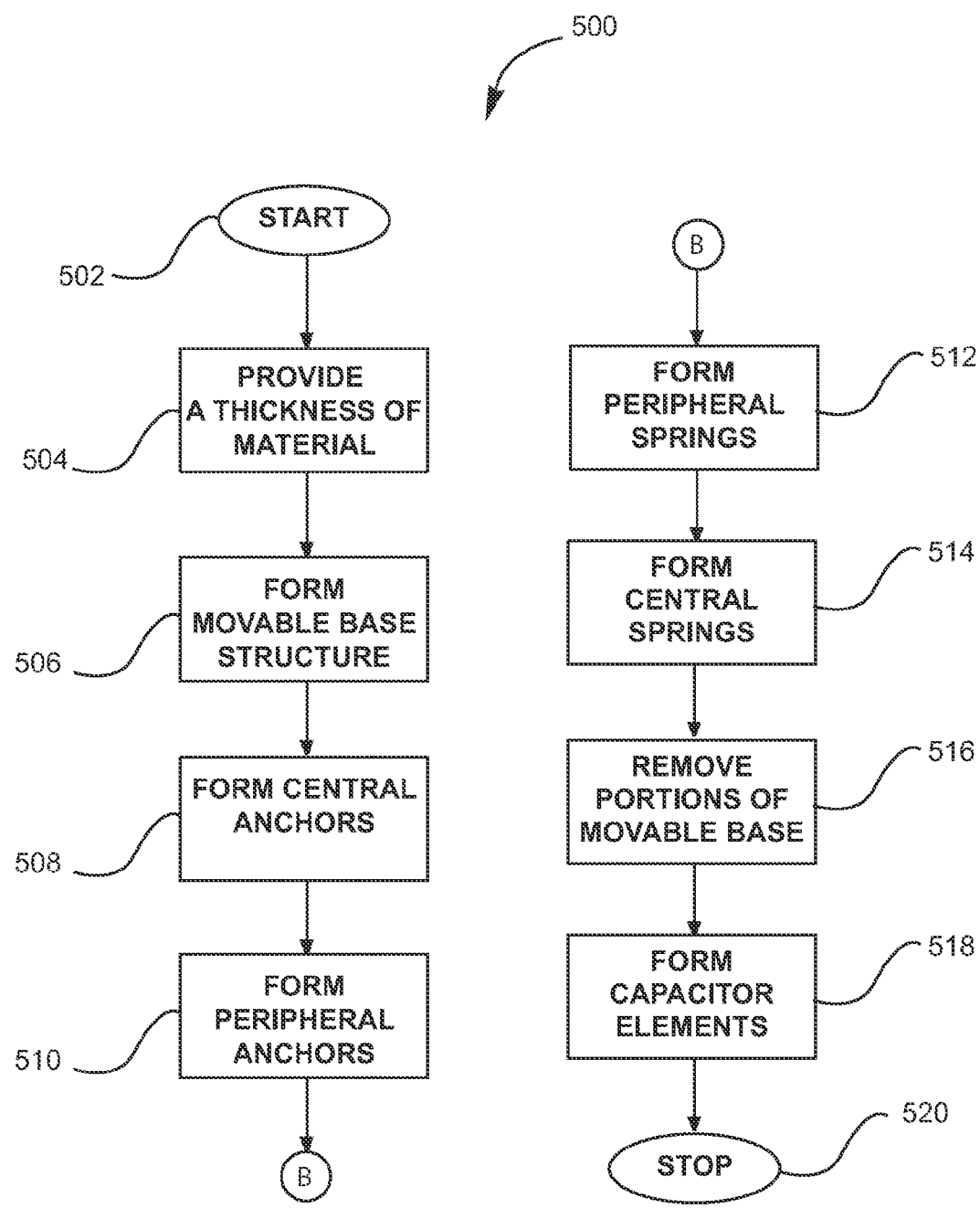
FIG. 5 is a simplified flow diagram of a transducer apparatus according to an embodiment of the present invention.

FIG. 5 is a simplified flow diagram illustrating a method for fabricating a transducer apparatus according to an embodiment of the present invention. This diagram is merely an example, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

As shown in FIG. 5, the present method can be briefly outlined below.
1. Start;
2. Provide a thickness of material;
3. Form a movable base structure from the thickness of material;
4. Form at least one central anchor structure;
5. Form at least one peripheral anchor structure;
6. Form at least one peripheral spring structure;
7. Form at least one central spring structure;
8. Remove at least one portion of the movable base;
9. Form at least one capacitor elements; and
10. Stop.

These steps are merely examples and should not unduly limit the scope of the claims herein. As shown, the above method provides a way of fabricating a transducer apparatus according to an embodiment of the present invention. One of ordinary skill in the art would recognize many other variations, modifications, and alternatives. For example, various steps outlined above may be added, removed, modified, rearranged, repeated, and/or overlapped, as contemplated within the scope of the invention.

As shown in FIG. 5, method 500 begins at start, step 502. The present method provides a fabrication method for forming a MEMS transducer apparatus. Many benefits are achieved by way of the present invention over conventional techniques. For example, the present technique provides an easy to use process that relies upon conventional technology. In some embodiments, the method provides higher device yields in dice per wafer with the integrated approach. Additionally, the method provides a process and system that are compatible with conventional process technology without substantial modifications to conventional equipment and processes. Preferably, the invention provides for an improved integrated micro electro-mechanical systems and electronic devices and related methods for a variety of uses. Depending upon the embodiment, one or more of these benefits may be achieved. These and other benefits will be described in more throughout the present specification and more particularly below.

Following step 502, a thickness of material can be provided, step 504. The thickness of material can include single crystal, polycrystalline, or amorphous silicon. At least one portion of the thickness of material can be removed to form a movable base structure, step 506, which can have an outer surface region and an inner surface region. In a specific embodiment, the movable base structure can include a single crystal silicon, polycrystalline silicon, or amorphous silicon. The moveable base structure can also include a thickness of a polymer or a thickness of a metal material. In other embodiments, the movable base structure can include other materials and combinations thereof. Those skilled in the art will recognize other variations, modifications, and alternatives.

Next, at least one central anchor structure can be formed and spatially disposed within a vicinity of the inner surface region of the movable base structure, step 508. Also, at least one peripheral anchor structure can be formed spatially disposed within a vicinity of the outer surface region of the movable base structure, step 510. In a specific embodiment, the central anchor structure(s) and the peripheral anchor structure(s) can include single crystal silicon, polycrystalline silicon, or amorphous silicon. The anchor structures can also include a polymer or metal material, or other materials or combinations thereof. Of course, there can be other variations, modifications, and alternatives.

After forming the anchor structures, at least one central spring structure can be formed and operably coupled to the central anchor structure(s) and at least one portion of the inner surface region of movable base structure, step 512. Also, at least one peripheral spring structure can be formed and operably coupled to the peripheral anchor structure(s) and at least one portion of the outer surface region of movable base structure, step 514. In a specific embodiment, the central spring structure(s) and the peripheral spring structure(s) can include single crystal silicon, polycrystalline silicon, or amorphous silicon. The spring structures can also include a polymer or metal material, or other materials or combinations thereof. Those skilled in the art will recognize other variations, modifications, and alternatives.

At least one portion of the movable base structure can be removed to form at least one recessed region, step 516. Then, at least one capacitor element can be formed spatially disposed within the recessed region(s) and between the outer surface region and the inner surface region of the movable base structure, step 518. In a specific embodiment, the number of the central spring structure(s) can be proportional to the number of the capacitor element(s). Also, the configuration of the central spring structure(s) can depend on the configuration of the capacitor element(s). The capacitor element(s) can include a fixed capacitor element and a movable capacitor element. The critical physical basis of the apparatus is to have the average displacement of the fixed capacitor element match the average displacement of the movable capacitor element. In a specific embodiment, the recessed region(s) can be roughly rectangular holes cut in the movable base structure. The rectangular holes can be produced via an etching process. In a specific embodiment, the capacitor element(s) can be disposed in pairs within each of the rectangular holes. Of course, there can be other variations, modifications, and alternatives.

In an embodiment, the movable base structure can be a rectangular movable base structure. In a specific embodiment, the peripheral anchor structure(s) are spatially disposed within a vicinity of the outer surface region near each of the corners of the rectangular movable base structure. Also, the central anchor structure(s) can be spatially disposed near the center of the rectangular movable base structure. In an embodiment, the apparatus can be coupled to a MEMS device or an electronic device. In a specific embodiment, the apparatus can be configured to be tolerant of external deformations. There can be other variations, modifications, and alternatives as well.

The above sequence of processes provides a fabrication method for forming a MEMS transducer apparatus according to an embodiment of the present invention. As shown, the method uses a combination of steps including providing a thickness of material, forming a movable base, forming anchor structures, forming spring structures, removing at least portion of the base, and forming at least one capacitor element. Other alternatives can also be provided where steps are added, one or more steps are removed, or one or more steps are provided in a different sequence without departing from the scope of the claims herein. Further details of the present method can be found throughout the present specification.

What is claimed is:

1. An apparatus comprising:
   a movable base structure comprising an outer surface region and an inner surface region;
   at least one capacitor element, the at least one capacitor element being spatially disposed adjacent to at least one portion of the movable base structure, wherein the at least one capacitor element is spatially disposed between the outer surface region and the inner surface region;
   at least one central anchor structure spatially disposed within a vicinity of the inner surface region of the movable base structure;
   at least one peripheral anchor structure spatially disposed within a vicinity of the outer surface region of the movable base structure; and
   at least one central spring structure, the at least one central spring structure being operably coupled to the at least one peripheral anchor structure and at least one portion of the inner surface region, wherein the at least one central spring structure is proportional to the number of the at least one capacitor element.

2. The apparatus of claim 1 wherein the movable base structure is a rectangular movable base structure.

3. The apparatus of claim 2 wherein the at least one peripheral anchor structure is spatially disposed within a vicinity of the outer surface region near the corners of the rectangular movable base structure.

4. The apparatus of claim 3 wherein the at least one central anchor structure is spatially disposed near the center of the rectangular movable base structure.

5. The apparatus of claim 1 wherein the apparatus is operably coupled to a MEMS device or an electronic device.

6. The apparatus of claim 5 configured to be tolerant of external deformations.

7. An apparatus comprising:
   a rectangular movable base structure comprising an outer surface region and an inner surface region;
   at least two central anchor structures spatially disposed within a vicinity of the inner surface region of the movable base structure, the at least two central anchor structures configured symmetrically;
   at least two peripheral spring structures, the at least two peripheral spring structures being operably coupled to the at least two peripheral anchor structures and at least one portion of the outer surface region, the at least two peripheral spring structures configured symmetrically; and
   at least two central spring structures, the at least two central spring structures being operably coupled to the at least two peripheral anchor structures and at least one portion of the inner surface region, the at least two central spring structures configured symmetrically.

8. The apparatus of claim 7 further comprising a plurality of capacitor elements, the capacitor elements being spatially disposed within the rectangular movable base structure between the inner surface region and outer surface region.

9. The apparatus of claim 8 configured to be tolerant of external deformations.

* * * * *